(12) United States Patent
Kook

(10) Patent No.: US 8,368,197 B2
(45) Date of Patent: Feb. 5, 2013

(54) SEMICONDUCTOR PACKAGE AND METHOD OF MANUFACTURING THE SEMICONDUCTOR PACKAGE

(75) Inventor: Joong-Kyo Kook, Incheon (KR)

(73) Assignee: Samsung Electronics Co., Ltd., Suwon-Si, Gyeonggi-Do (KR)

(*) Notice: Subject to any disclaimer, the term of this patent is extended or adjusted under 35 U.S.C. 154(b) by 301 days.

(21) Appl. No.: 12/841,653

(22) Filed: Jul. 22, 2010

(65) Prior Publication Data
US 2011/0068449 A1 Mar. 24, 2011

(30) Foreign Application Priority Data
Sep. 24, 2009 (KR) .................. 10-2009-0090340

(51) Int. Cl.
*H01L 23/02* (2006.01)
*H01L 21/00* (2006.01)
(52) U.S. Cl. ......... 257/686; 257/E23.141; 257/E23.177; 257/E25.013; 438/109
(58) Field of Classification Search .............. 257/686, 257/685, E23.141, E23.177, E25.013; 438/109
See application file for complete search history.

(56) References Cited

U.S. PATENT DOCUMENTS

| | | | |
|---|---|---|---|
| 6,215,182 B1 | 4/2001 | Ozawa et al. | |
| 2005/0067694 A1* | 3/2005 | Pon et al. | 257/723 |
| 2006/0267173 A1* | 11/2006 | Takiar et al. | 257/686 |
| 2010/0181661 A1* | 7/2010 | Takemoto et al. | 257/686 |

FOREIGN PATENT DOCUMENTS

| | | |
|---|---|---|
| JP | 2000-124391 | 4/2000 |
| JP | 2003-209218 | 7/2003 |
| JP | 2008-085032 | 4/2008 |

* cited by examiner

*Primary Examiner* — Long Tran
(74) *Attorney, Agent, or Firm* — F. Chau & Associates, LLC

(57) ABSTRACT

A semiconductor package includes a first semiconductor chip, a second semiconductor chip, a stepped pad, a plurality of first bonding wires and a second bonding wire. The first semiconductor chip is stacked on a substrate having a plurality of bonding pads, the first semiconductor chip having a plurality of first chips pads formed along a side portion of the first semiconductor chip. The second semiconductor chip is stacked like a step of a staircase on the first semiconductor chip to form a stepped portion through which the first chip pads are exposed on the first semiconductor chip, the second semiconductor chip having a plurality of second chip pads formed along a side portion of the first semiconductor chip. The stepped pad is arranged between the first chip pads on the stepped portion of the first semiconductor chip, the stepped pad including an adhesive pad adhered to the first semiconductor chip and a conductive pad formed on the adhesive pad. A plurality of the first bonding wires electrically connect between the one second chip pad and the one first chip pad and/or between the one first chip pad and the one bonding pad. The second bonding wire electrically connects between the one second chip pad and the one bonding pad using the stepped pad.

16 Claims, 8 Drawing Sheets

SEMICONDUCTOR PACKAGE AND METHOD OF MANUFACTURING THE SEMICONDUCTOR PACKAGE

PRIORITY STATEMENT

This application claims priority under 35 U.S.C. §119 to Korean Patent Application No. 2009-90340, filed on Sep. 24, 2009 in the Korean Intellectual Property Office (KIPO), the entire contents of which are herein incorporated by reference.

BACKGROUND

1. Field

Example embodiments relate to a semiconductor package and a method of manufacturing the semiconductor package. More particularly, example embodiments relate to a semiconductor package including semiconductor chips that are stacked on a substrate and electrically connected to the substrate by a plurality of bonding wires and a method of manufacturing the semiconductor package.

2. Description of the Related Art

Generally, semiconductor devices are manufactured by a fabrication ("fab") process for forming electrical circuits including electrical elements on a semiconductor substrate, e.g., a silicon wafer, an electrical die sorting (EDS) process for inspecting electrical properties of chips formed by the fab process, and a packaging process for sealing the chips with resin, e.g., epoxy, and sorting the chips.

Through the packaging process, the semiconductor device, e.g., a semiconductor chip, is electrically connected to a mounting substrate, and the semiconductor chip is sealed to be protected from the outside. The semiconductor package including the semiconductor chip mounted on the mounting substrate dissipates heat from the semiconductor chip outside through cooling functions thereof.

The semiconductor package may include the mounting substrate and a plurality of semiconductor chips mounted on the mounting substrate. The semiconductor chips may be electrically connected to the mounting substrate by a plurality of bonding wires.

Recently, as the number of input/output signal lines for the semiconductor chip is increased, dimensions of the wiring substrate and line widths between wiring patterns are reduced. In addition, as the number of the stacked semiconductor chips is increased, the height of the semiconductor package is increased.

Especially, because the length and loop height of the bonding wire for electrically connecting a chip pad of the uppermost semiconductor chip to a bonding pad of the mounting substrate are increased, contact failures between adjacent bonding wires or between the bonding wire and the semiconductor chips occur frequently. Accordingly, the semiconductor package may need to have a structure capable of providing a free wire route design without changing the routes and patterns of the existing bonding wires.

SUMMARY

Example embodiments provide a semiconductor package capable of providing a free wiring routing design.

Example embodiments provide a method of manufacturing the semiconductor package.

According to example embodiments, a semiconductor package includes a first semiconductor chip, a second semiconductor chip, a stepped pad, a plurality of first bonding wires and a second bonding wire. The first semiconductor chip is stacked on a substrate having a plurality of bonding pads, the first semiconductor chip having a plurality of first chip pads formed along a side portion of the first semiconductor chip. The second semiconductor chip is stacked like a step of a staircase on the first semiconductor chip to form a stepped portion through which the first chip pads are exposed on the first semiconductor chip, the second semiconductor chip having a plurality of second chip pads formed along a side portion of the first semiconductor chip. The stepped pad is arranged between the first chip pads on the stepped portion of the first semiconductor chip, the stepped pad including an adhesive pad adhered to the first semiconductor chip and a conductive pad formed on the adhesive pad. A plurality of the first bonding wires are electrically connected between the one second chip pad and the one first chip pad and/or between the one first chip pad and the one bonding pad. The second bonding wire is electrically connected between the one second chip pad and the one bonding pad using the stepped pad.

In an example embodiment, the adhesive pad of the stepped pad may include a nonconductive adhesive film and the conductive pad of the stepped pad may include a conductive material.

In another example embodiment, the stepped pad may be adhered to a dummy pad that is not electrically connected to a circuit element of the first semiconductor chip.

In still another example embodiment, the semiconductor package may further include at least one routing stepped pad arranged at a desired position on the second semiconductor chip, and the second bonding wire may be electrically connected between the one second chip pad and the one bonding pad using the stepped pad and the routing stepped pad.

In an example embodiment, the semiconductor package may further include at least one third semiconductor chip that is stacked like a step in a staircase between the first semiconductor chip and the substrate.

In an example embodiment, the first chip pads may be arranged in a direction substantially the same as the arrangement direction of the second chip pads.

In an example embodiment, the first and second bonding pads may extend substantially perpendicular to the side portion of the window.

In further still another example embodiment, the first and second semiconductor chips may be stacked on a lead frame.

In an example embodiment, the semiconductor package may further include a first adhesive layer between the first semiconductor chip and the substrate and a second adhesive layer between the second semiconductor chip and the first semiconductor chip.

In an example embodiment, the semiconductor package may further include a sealing member that is formed on the substrate to cover the first and second semiconductor chips.

According to example embodiments, in a method of manufacturing a semiconductor package, a first semiconductor chip is stacked on a substrate having a plurality of bonding pads, the first semiconductor chip having a plurality of first chip pads formed along a side portion of the first semiconductor chip. A second semiconductor chip is stacked like a step of a staircase on the first semiconductor chip to form a stepped portion through which the first chip pads are exposed on the first semiconductor chip, the second semiconductor chip having a plurality of second chip pads formed along a side portion of the first semiconductor chip. A stepped pad is adhered between the first chip pads on the stepped portion of the first semiconductor chip. A plurality of first bonding wires are electrically connected between the one second chip pad and the one first chip pad and/or between the one first chip pad and the one bonding pad. A second bonding wire is electrically connected between the one second chip pad and the one bonding pad using the stepped pad.

In an example embodiment, adhering the stepped pad may include adhering an adhesive pad on the stepped portion of the first semiconductor chip exposed from the side portion of the second semiconductor chip, and forming a conductive pad on the adhesive pad.

In an example embodiment, the adhesive pad may include a nonconductive adhesive film.

In an example embodiment, the method may further include stacking at least one third semiconductor chip like a step of a staircase between the first semiconductor chip and the substrate.

In an example embodiment, the method may further include forming a sealing member on the substrate to cover the first and second semiconductor chips.

In another example embodiment, adhering the stepped pad may include adhering the stepped pad to a dummy pad that is not electrically connected to a circuit element of the first semiconductor chip.

In still another example embodiment, the method may further include adhering at least one routing stepped pad at a desired position on the second semiconductor chip, and electrically connecting the second bonding wire between the second chip pad and the bonding pad may include connecting the second bonding wire between the second chip pad and the bonding pad using the stepped pad and the routing stepped pad.

In further still another example embodiment, stacking the first semiconductor chip may include stacking the first semiconductor chip on a lead frame.

According to example embodiments, a semiconductor package includes a plurality of semiconductor chips stacked on a substrate and stepped pads serving as "stepping stones" between the uppermost semiconductor chip and the substrate. The stepped pads may relay intermediate wires to electrically connect the uppermost semiconductor chip to a bonding pad of the substrate.

Accordingly, the stepped pads may provide a free wiring route design for a bonding wire. Additionally, the stepped pads may compensate for the height differences between the stacked semiconductor chips to decrease the loop height of the bonding wire to thereby miniaturize the semiconductor package. Further, the bonding wire may be prevented from making contact with the adjacent another bonding wire that is spaced apart by a relatively small distance or the semiconductor chips, to thereby improve reliability of the semiconductor package.

BRIEF DESCRIPTION OF THE DRAWINGS

Example embodiments will be more clearly understood from the following detailed description taken in conjunction with the accompanying drawings.

FIG. 1 is a plan view illustrating a semiconductor package in accordance with a first example embodiment.

FIG. 2 is a cross-sectional view taken along the II-II' lined in FIG. 1.

FIG. 3 is an enlarged view illustrating the stepped pad of the semiconductor package in FIG. 2.

FIG. 4 is a plan view illustrating a semiconductor package in accordance with a second example embodiment.

FIG. 5 is a cross-sectional view taken along the V-V' line in FIG. 4.

FIG. 6 is a plan view illustrating a semiconductor package in accordance with a third example embodiment.

FIG. 7 is a cross-sectional view illustrating a semiconductor package in accordance with a fourth example embodiment.

FIGS. 8 to 11 are cross-sectional views illustrating a method of manufacturing the semiconductor package in FIG. 1.

DETAILED DESCRIPTION OF EXAMPLE EMBODIMENTS

Figure 1:
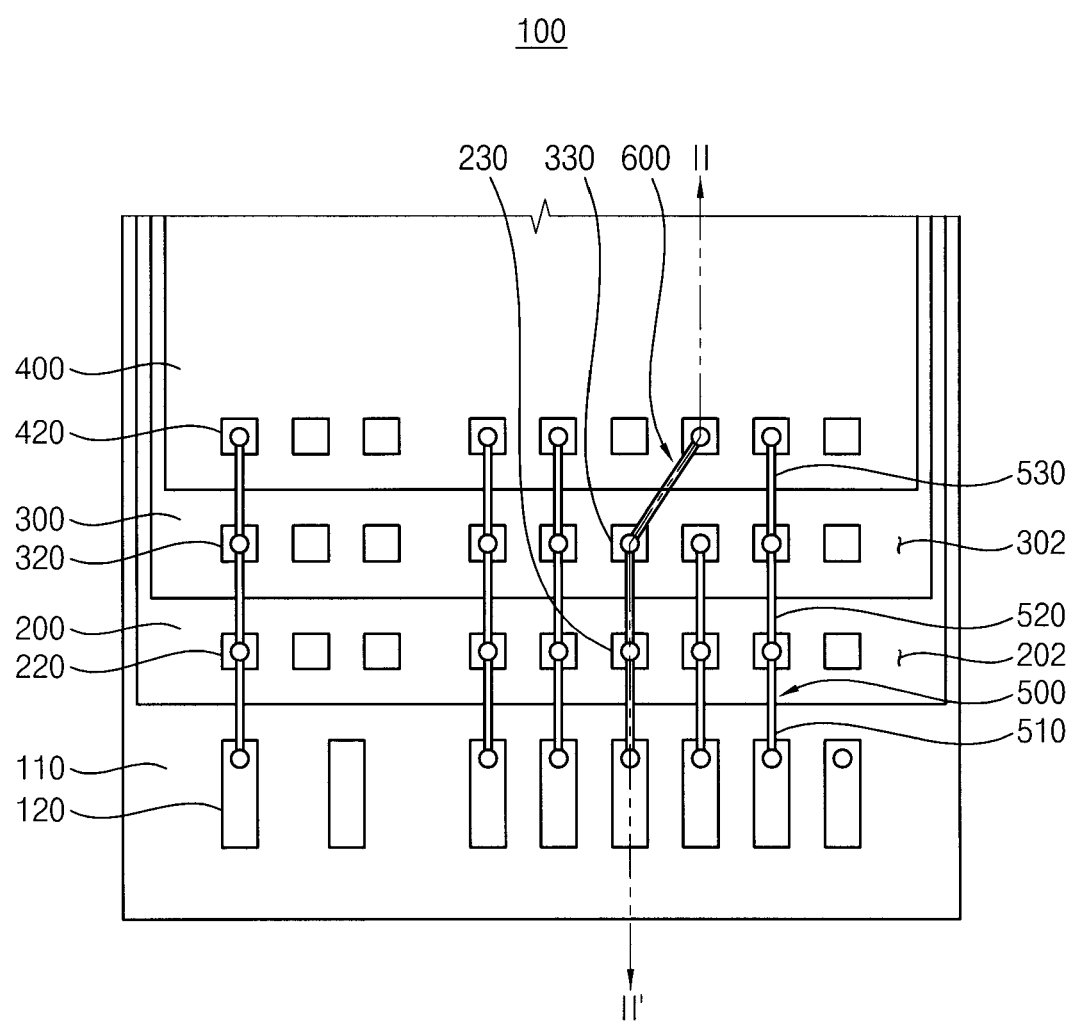
FIGS. 1 to 11 represent non-limiting, example embodiments as described herein.

Various example embodiments will be described more fully hereinafter with reference to the accompanying drawings, in which example embodiments are shown. Example embodiments may, however, be embodied in many different forms and should not be construed as limited to example embodiments set forth herein. Rather, these example embodiments are provided so that this disclosure will be thorough and complete, and will fully convey the scope of example embodiments to those skilled in the art. In the drawings, the sizes and relative sizes of layers and regions may be exaggerated for clarity.

It will be understood that when an element or layer is referred to as being "on," "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like numerals refer to like elements throughout. As used herein, the term "and/or" includes any and all combinations of one or more of the associated listed items.

It will be understood that, although the terms first, second, third, etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of example embodiments.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular example embodiments only and is not intended to be limiting of example embodiments. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Example embodiments are described herein with reference to cross-sectional illustrations that are schematic illustrations of idealized example embodiments (and intermediate structures). As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of example embodiments.

Unless otherwise defined, all terms (including technical and scientific terms) used herein have the same meaning as commonly understood by one of ordinary skill in the art to which example embodiments belong. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Hereinafter, example embodiments will be explained in detail with reference to the accompanying drawings.

Figure 2:
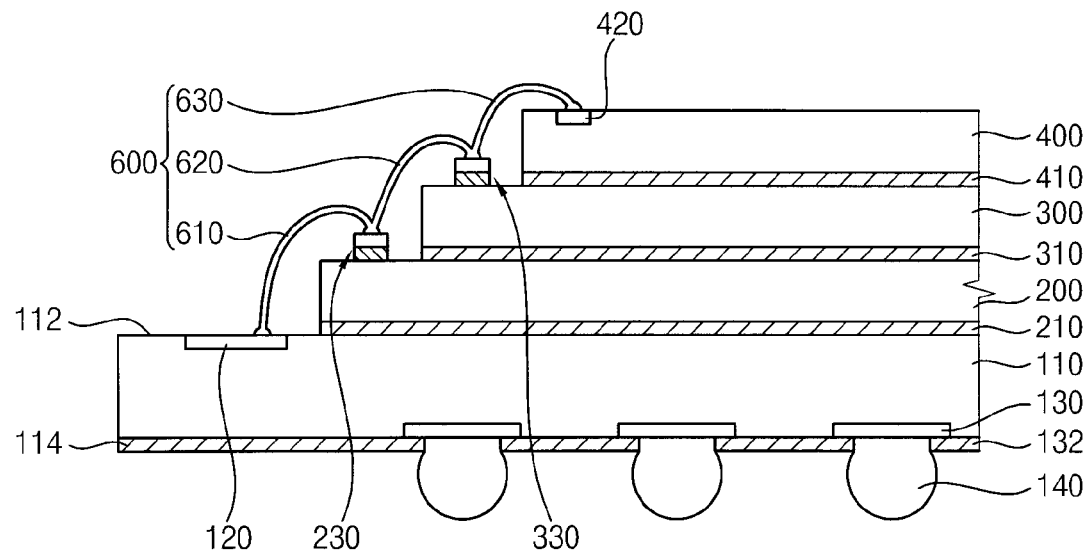

FIG. 1 is a plan view illustrating a semiconductor package in accordance with a first example embodiment. FIG. 2 is a cross-sectional view taken along the II-IP lined in FIG. 1.

Referring to FIGS. 1 and 2, a semiconductor package 100 includes a substrate 110, first, second and third semiconductor chips 200, 300, 400 sequentially stacked on the substrate 110, and a plurality of bonding wires electrically connecting the first, second and third semiconductor chips to the substrate 110.

The substrate for mounting the first, second and third semiconductor chips 200, 300, 400 may have a first face 112 and a second face 114 opposite to the first face 112. A plurality of bonding pads 120 may be formed on the first face 112. A plurality of solder ball pads 130 may be formed on the second face 114. For example, the substrate 110 may be a printed circuit board (PCB).

In a first example embodiment, the first, second and third semiconductor chips 200, 300, 400 may include a plurality of the circuit elements. The circuit element may include a plurality of memory devices. Examples of the memory devices may be a volatile memory device and a non-volatile memory device. Examples of the volatile memory device may be DRAM, SRAM, etc. Examples of the non-volatile memory device may be EPROM, EEPROM, Flash EEPROM, etc.

The first semiconductor chip 200 may be stacked on the first face 112 of the substrate 110. For example, the first semiconductor chip 200 may be adhered to the substrate 110 via a first adhesive layer 210.

A plurality of first chip pads 220 may be formed on an active surface of the first semiconductor chip 200. In a first example embodiment, the first chip pads 220 may be formed along a side portion of the first semiconductor chip 200. The first chip pads 220 may be arranged in a first direction along a peripheral region of the first semiconductor chip 200.

The second semiconductor chip 300 may be stacked on the first semiconductor chip 200. For example, the second semiconductor chip 300 may be adhered to the first semiconductor chip 200 via a second adhesive layer 310.

A plurality of second chip pads 320 may be formed on an active surface of the second semiconductor chip 300. In a first example embodiment, the second chip pads 320 may be arranged in a direction substantially the same as the first direction along a peripheral region of the second semiconductor chip 300.

The third semiconductor chip 400 may be stacked on the second semiconductor chip 300. For example, the third semiconductor chip 400 may be adhered to the second semiconductor chip 300 via a third adhesive layer 410.

A plurality of third chip pads 420 may be formed on an active surface of the third semiconductor chip 400. In a first example embodiment, the third chip pads 420 may be arranged in a direction substantially the same as the first direction along a peripheral region of the third semiconductor chip 400.

In a first example embodiment, the second semiconductor chip 300 may be stacked like a step of a staircase to form a first stepped portion 202 on the first semiconductor chip 200. In the first stepped portion 202 provided on the first semiconductor chip 200, the first chip pads 220 of the first semiconductor chip 200 may be exposed through the side portion of the second semiconductor chip 300.

The third semiconductor chip 400 may be stacked like a step of a staircase to form a second stepped portion 302 on the second semiconductor chip 300. In the second stepped portion 302 provided on the second semiconductor chip 300, the second chip pads 320 of the second semiconductor chip 300 may be exposed through the side portion of the third semiconductor chip 400.

In a first example embodiment, a first stepped pad 230 may be arranged on the first stepped portion 202 of the first semiconductor chip 200. The first stepped pad 230 may be arranged between the first chip pads 220. Accordingly, the first stepped pad 230 on the first semiconductor chip 200 may be exposed through the side portion of the second semiconductor chip 300.

In a first example embodiment, a second stepped pad 330 may be arranged on the second stepped portion 302 of the second semiconductor chip 300. The second stepped portion 330 may be between the second chip pads 320. Accordingly, the second stepped pad 330 on the second semiconductor chip 300 may be exposed through the side portion of the third semiconductor chip 400.

The sizes of the first and second stepped portions 230 and 330 may be determined based on the distance between the adjacent chip pad and the thickness of the bonding wire. For example, the sizes of the first and second stepped pads 230 and 330 may be substantially the same as those of the first, second and third chip pads 220, 320, 420. The heights of the first and second stepped pads 230 and 330 may be determined based on the loop height of the bonding wire and the thicknesses of the first to third semiconductor chips.

In a first example embodiment, the bonding wires may include a first bonding wire 500 and a second bonding wire 600. The bonding pads 120 may be electrically connected to any one of the first, second and third chip pads 220, 320, 420 by the first bonding wires 500 and/or the second bonding wire 600.

For example, the first bonding wire 500 may include a first wire 510, a second wire 520 and a third wire 530. The first wire 510 may electrically connect the one bonding pad 120 to the one first chip pad 220. The second wire 520 may electrically connect the one first chip pad 220 to the one second chip pad 320. The third wire 530 may electrically connect the one second chip pad 320 to the one third chip pad 420. Accordingly, the bonding pad 120 may be electrically connected to the third chip pad 420 by the first to third wires 510, 520, 530.

Alternatively, the first bonding wire 500 may include a first wire 510 and a second wire 520. The first wire 510 may electrically connect the one bonding pad 120 to the one first chip pad 220. The second wire 520 may electrically connect the one first chip pad 220 to the one second chip pad 320. Accordingly, the bonding pad 120 may be electrically connected to the second chip pad 320 by the first and second wires 510 and 520.

As illustrated in FIG. 2, in a first example embodiment, the second bonding wire 600 may electrically connect the one bonding pad 120 to the one third chip pad 420 using the first and second stepped portions 230 and 330.

The second boding wire 600 may include a fourth wire 610, a fifth wire 620 and a sixth wire 630. The fourth wire 610 may electrically connect the one bonding pad 120 to a first conductive pad of the first stepped pad 230. The fifth wire 620 may electrically connect the first conductive pad of the first stepped pad 230 to a second conductive pad (334, see FIG. 3) of the second stepped pad 330. The sixth wire 630 may electrically connect the second conductive pad 334 of the second stepped pad 330 to the third chip pad 420. Accordingly, the bonding pad 120 may be electrically connected to the third chip pad 420 using the first and second stepped pads 230 and 330.

Figure 3:
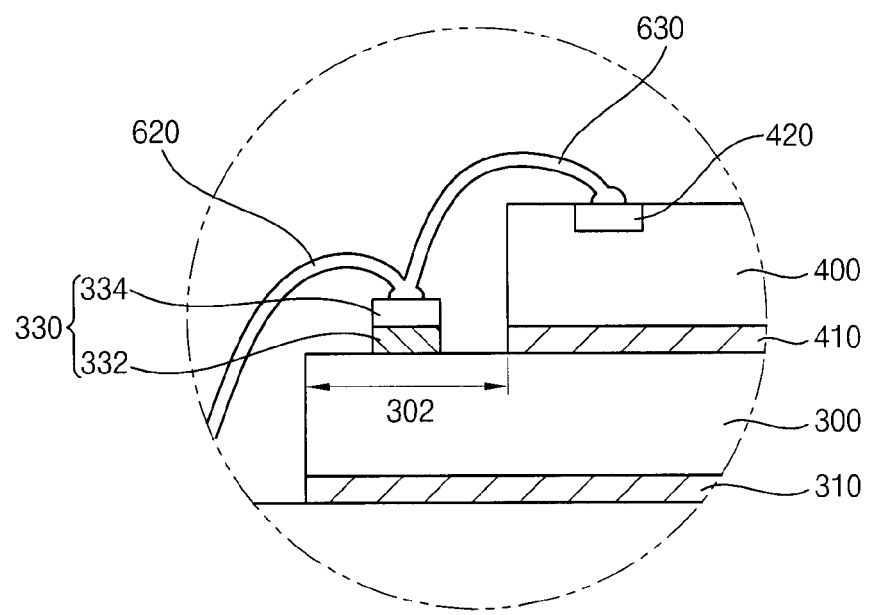

FIG. 3 is an enlarged view illustrating the stepped pad of the semiconductor package in FIG. 2.

Referring to FIG. 3, the second stepped pad 330 may include a second adhesive pad 332 and a second conductive pad 334. The second adhesive pad 332 may be adhered to the second stepped portion 302 of the second semiconductor chip 300. The second conductive pad 334 may be formed on the second adhesive pad 332.

For example, the second adhesive pad 332 may include a nonconductive adhesive film. The second conductive pad 334 may include a conductive material. Examples of the conductive material may be gold (Au), silver (Ag), copper (Cu), aluminum (Al), etc. The conductive material may be selected from the material having a great adhesive strength for the bonding wire.

The second stepped pad 330 may be disposed on the second stepped portion 302 of the second semiconductor chip 300. The second stepped pad 330 may be arranged between the second chip pads (320, see FIG. 1). The second adhesive pad 332 of the second steppe pad 330 may be adhered to the second stepped portion 302 of the second semiconductor chip 300. The second conductive pad 334 may be formed on the second adhesive pad 332.

The first stepped pad may be substantially the same as the second stepped pad 330. For example, the first stepped pad may include a first adhesive pad and a first conductive pad. The first adhesive pad may be adhered to the first stepped portion of the first semiconductor chip 200. The first conductive pad may be formed on the first adhesive pad.

For example, the first adhesive pad may include a nonconductive adhesive film. The first conductive pad may include a conductive material. The first conductive pad may be formed using a material the same as the bonding wire or a material having a great adhesive strength for the bonding wire.

Referring again to FIGS. 1 and 3, the fourth wire 610 of the second bonding wire 600 may electrically connect the one bonding pad 120 to the first conductive pad of the first stepped pad 230. The fifth wire 620 of the second bonding wire 600 may electrically connect the first conductive pad of the first stepped pad 230 to the second conductive pad 334 of the second stepped pad 330. The fifth wire 630 of the second bonding wire 600 may electrically connect the second conductive pad of the second stepped pad 330 to the third chip pad 420. Accordingly, the bonding pad 120 may be electrically connected to the third chip pad 420 using the first and second stepped pads 230 and 330.

In a first example embodiment, the first stepped pad 230 may be arranged at a desired position between the first chip pads 220 on the first stepped portion 202 of the first semiconductor chip 200. The second stepped pad 330 may be arranged at a desired position between the second chip pads 320 on the second stepped portion 302 of the second semiconductor chip 300. For example, the first and second stepped portion 230 and 330 may be easily adhered at desired positions using their adhesive strengths during the package manufacturing process.

Accordingly, the first and second stepped pads 230 and 330 may relay the fourth, fifth and sixth wires 610, 620, 630 of the second bonding wire 600 to electrically connect the third chip pad 420 of the uppermost semiconductor chip 400 to the bonding pad 120. Thus, the first and second stepped pads 230 and 330 may provide a free wiring route design for the second bonding wire 600.

The heights of the first and second stepped pads 230 and 330 may be determined based on the height differences between the stacked semiconductor chips 200, 300, 400. Accordingly, the first and second stepped pads 230 and 330 may compensate the height differences between the stacked semiconductor chips 200, 300, 400 to decrease the loop height of the second bonding wire 600 to thereby miniaturize the semiconductor package 100.

Further, the first and second stepped pads 230, 330 may be arranged to have selected heights at desired positions between the first and second chips pads 220, 320. Accordingly, the second bonding wire 600 may be prevented from making contact with the adjacent first bonding wire 500 that is spaced apart by a relatively small distance or the first to third semiconductor chips 200, 300, 400, to thereby improve reliability of the semiconductor package.

In a first example embodiment, a sealing member (not illustrated) may be formed on the first face 112 of the substrate 110 to protect the first, second and third semiconductor chips protect them from the outside.

A plurality of the solder ball pads 130 may be formed on the second face 114 of the substrate 110. A solder ball 140 may be disposed on the solder ball pad 130 exposed by an insulation layer 132, and the semiconductor package 100 may be mounted on a module substrate (not illustrated) via the solder balls 140 to provide a memory module (not illustrated).

Figure 4:
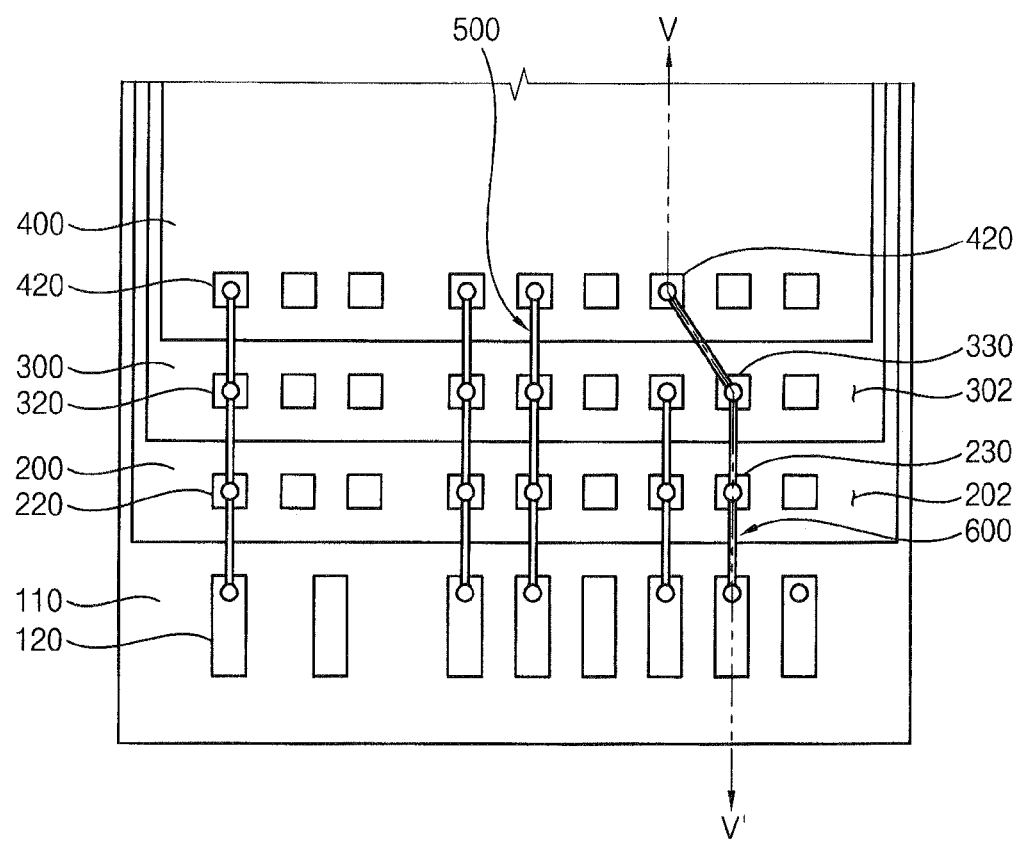
Figure 5:
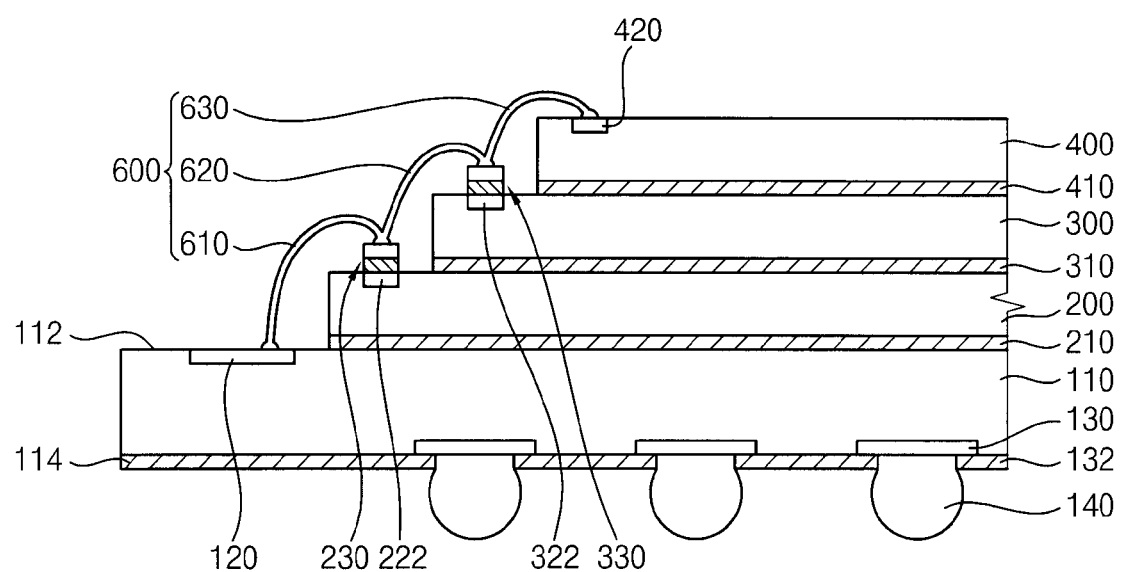

FIG. 4 is a plan view illustrating a semiconductor package in accordance with a second example embodiment. FIG. 5 is a cross-sectional view taken along the V-V' line in FIG. 4. The semiconductor package of the present embodiment is substantially the same as in the embodiment of FIG. 1 except arrangement of the stepped pads. Thus, the same reference numerals will be used to refer to the same or like elements as those described in the embodiment of FIG. 1 and any further repetitive explanation concerning the above elements will be omitted.

Referring to FIGS. 4 and 5, a semiconductor package 101 in accordance with a second example embodiment includes a substrate 110, first, second and third semiconductor chips 200, 300, 400 sequentially stacked on the substrate 110, and a plurality of bonding wires electrically connecting the first, second and third semiconductor chips to the substrate 110.

A plurality of bonding pads 120 may be formed on the first face 112. The first, second and third semiconductor chips 200, 300, 400 may include a plurality of the circuit elements therein.

The first semiconductor chip 200 may be adhered to the substrate 110 via a first adhesive layer 210. A plurality of first chip pads 220 may be formed on an active surface of the first semiconductor chip 200. The first chip pads 220 may be formed along a side portion of the first semiconductor chip 200. The first chip pads 220 may be arranged in a first direction along a peripheral region of the first semiconductor chip 200.

The second semiconductor chip 300 may be adhered to the first semiconductor chip 200 via a second adhesive layer 310. A plurality of second chip pads 320 may be formed on an active surface of the second semiconductor chip 300. The second chip pads 320 may be arranged in a direction substantially the same as the first direction along a peripheral region of the second semiconductor chip 300.

The third semiconductor chip 400 may be adhered to the second semiconductor chip 300 via a third adhesive layer 410. A plurality of third chip pads 420 may be formed on an active surface of the third semiconductor chip 400. The third chip pads 420 may be arranged in a direction substantially the same as the first direction along a peripheral region of the third semiconductor chip 400.

In a second example embodiment, a first dummy pad 222 may be formed on an active surface of the first semiconductor chip 200. The first dummy pad 222 may be arranged between the first chip pads 220. A second dummy pad 322 may be formed on an active surface of the second semiconductor chip 300. The second dummy pad 322 may be arranged between the second chip pads 320. In this case, the first dummy pad 222 may not be electrically connected to the circuit element of the first semiconductor chip 200. The second dummy pad 322 may not be electrically connected to the circuit element of the second semiconductor chip 300.

In a second example embodiment, the second semiconductor chip 300 may be stacked like a step of a staircase to form a first stepped portion 202 on the first semiconductor chip 200. In the first stepped portion 202 provided on the first semiconductor chip 200, the first chip pads 220 and the first dummy pad 222 of the first semiconductor chip 200 may be exposed through the side portion of the second semiconductor chip 300.

The third semiconductor chip 400 may be stacked like a step of a staircase to form a second stepped portion 302 on the second semiconductor chip 300. In the second stepped portion 302 provided on the second semiconductor chip 300, the second chip pads 320 and the second dummy pad 322 of the second semiconductor chip 300 may be exposed through the side portion of the third semiconductor chip 400.

In a second example embodiment, a first stepped pad 230 may be arranged on the first dummy pad 232 of the first semiconductor chip 200. Accordingly, the first stepped pad 230 on the first semiconductor chip 200 may be exposed through the side portion of the second semiconductor chip 300.

A second stepped pad 330 may be arranged on the second dummy pad 322 of the second semiconductor chip 300. Accordingly, the second stepped pad 330 on the second semiconductor chip 300 may be exposed through the side portion of the third semiconductor chip 400.

The second bonding wire 600 may electrically connect the one bonding pad 120 to the one third chip pad 420 using the first and second stepped portions 230 and 330.

For example, the second boding wire 600 may include a fourth wire 610, a fifth wire 620 and a sixth wire 630. The fourth wire 610 may electrically connect the one bonding pad 210 to a first conductive pad of the first stepped pad 230. The fifth wire 620 may electrically connect the first conductive pad of the first stepped pad 230 to a second conductive pad of the second stepped pad 330. The sixth wire 630 may electrically connect the second conductive pad of the second stepped pad 330 to the third chip pad 420. Accordingly, the bonding pad 120 may be electrically connected to the third chip pad 420 using the first and second stepped pads 230 and 330.

In a second example embodiment, the first stepped pad 230 and the second stepped portion 330 may be easily adhered at desired positions using adhesive strengths of the first and second stepped portions during the package manufacturing process. Accordingly, the first and second stepped pads 230 and 330 may be arranged on the first and second dummy pads 222 and 322 to serve as stepping stones for electrically connecting the third chip pad 420 of the uppermost semiconductor chip 400 to the bonding pad 120. Thus, the first and second stepped portion 230 and 300 may provide a free wiring route design for the second bonding wire 600.

Figure 6:
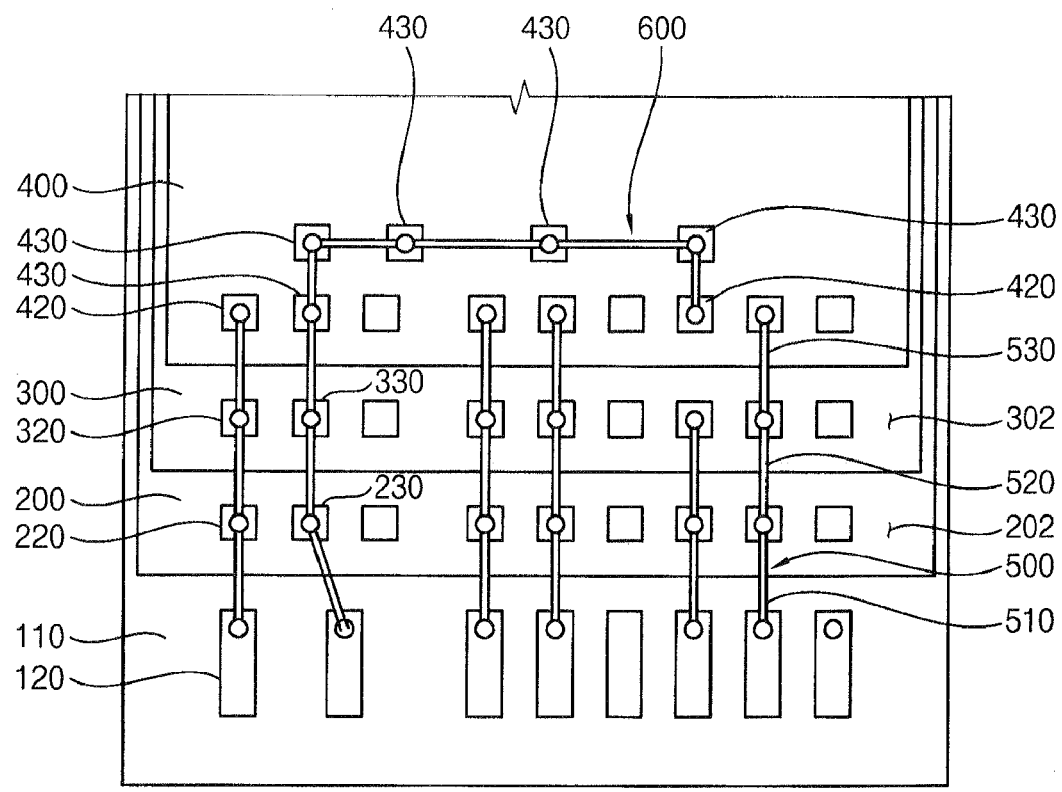

FIG. 6 is a plan view illustrating a semiconductor package in accordance with a third example embodiment. The semiconductor package of the present embodiment is substantially the same as in the embodiment of FIG. 1 except arrangement of the stepped pads. Thus, the same reference numerals will be used to refer to the same or like elements as those described in the embodiment of FIG. 1 and any further repetitive explanation concerning the above elements will be omitted.

Referring to FIG. 6, a semiconductor package 102 in accordance with a third example embodiment includes a substrate 110, first, second and third semiconductor chips 200, 300, 400 sequentially stacked on the substrate 110, and a plurality of bonding wires electrically connecting the first, second and third semiconductor chips to the substrate 110.

The second semiconductor chip 300 may be stacked like a step of a staircase to form a first stepped portion 202 on the first semiconductor chip 200. In the first stepped portion 202 provided on the first semiconductor chip 200, the first chip pads 220 of the first semiconductor chip 200 may be exposed through the side portion of the second semiconductor chip 300.

The third semiconductor chip 400 may be stacked like a step of a staircase to form a second stepped portion 302 on the second semiconductor chip 300. In the second stepped portion 302 provided on the second semiconductor chip 300, the second chip pads 320 of the second semiconductor chip 300 may be exposed through the side portion of the third semiconductor chip 400.

A first stepped pad 230 may be arranged on the first stepped portion 202 of the first semiconductor chip 200. The first stepped pad 230 may be arranged between the first chip pads 220. A first adhesive pad of the first stepped pad 230 may be adhered to the first stepped portion 202 of the first semiconductor chip 200. A first conductive pad may be formed on the first adhesive pad.

A second stepped pad 330 may be arranged on the second stepped portion 302 of the second semiconductor chip 300. The second stepped pad 330 may be arranged between the second chip pads 320. A second adhesive pad of the second stepped pad 330 may be adhered to the second stepped portion 302 of the second semiconductor chip 300. A second conductive pad may be formed on the second adhesive pad.

In a third example embodiment, at least one routing stepped pad 430 may be arranged on the third semiconductor chip 400. As illustrated in FIG. 6, five routing stepped pads 430 may be arranged at desired positions between the third chip pads 420 on the third semiconductor chip 400 to thereby provide a free wiring route for a second bonding wire 600.

The first and second stepped pads 230, 330 and the routing stepped pads 430 may be easily adhered on each of the semiconductor chips at desired positions using their adhesive strengths during the package manufacturing process. The second bonding wire 600 may electrically connect the one bonding pad 120 to the one third chip pad 420 using the first and second stepped portions 230 and 330 and the routing stepped pads 430.

Thus, the first and second stepped pads 230 and 330 and the routing stepped pads 430 may serve as stepping stones for electrically connecting the third chip pad 420 of the uppermost semiconductor chip 400 to the bonding pad 120 to thereby provide a free wiring route design.

Figure 7:
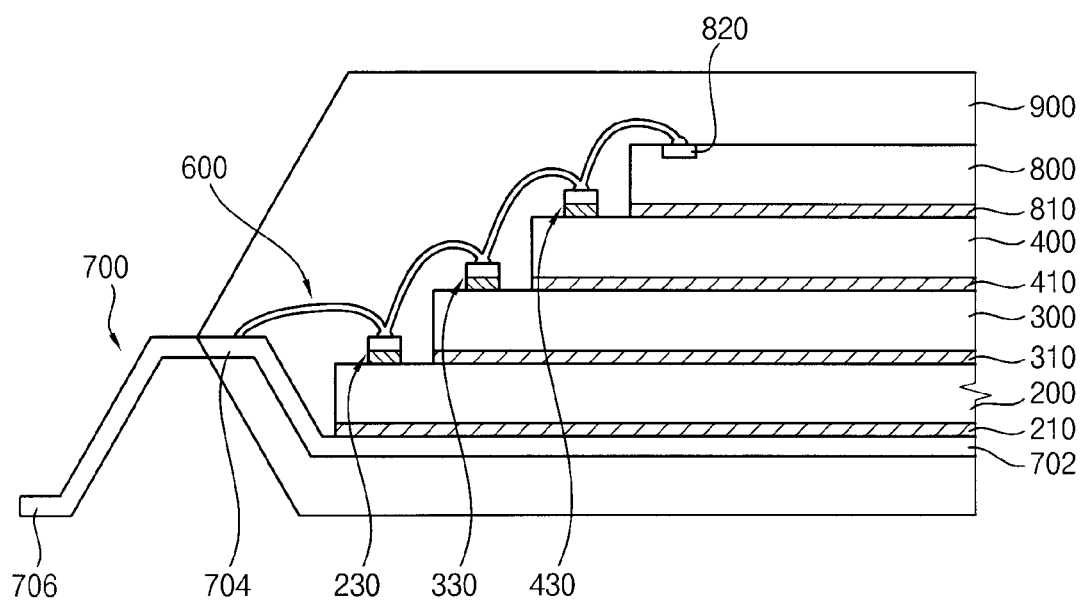

FIG. 7 is a cross-sectional view illustrating a semiconductor package in accordance with a fourth example embodiment. The semiconductor package of the present embodiment is substantially the same as in the embodiment of FIG. 1 except the number of stacked semiconductor chips and an element for mounting the semiconductor chips. Thus, the same reference numerals will be used to refer to the same or like elements as those described in the embodiment of FIG. 1 and any further repetitive explanation concerning the above elements will be omitted.

Referring to FIG. 7, a semiconductor package 103 in accordance with a fourth example embodiment includes a lead frame 700, first, second, third and fourth semiconductor chips 200, 300, 400, 800 sequentially stacked on the lead frame 700, and a plurality of bonding wires electrically connecting the first, second, third and fourth semiconductor chips to the lead frame 700.

In a fourth example embodiment, the first, second, third and fourth semiconductor chips 200, 300, 400, 800 may be stacked like steps of a staircase on a stage portion 702 of the lead frame 700.

A fourth chip pad 820 of the uppermost fourth semiconductor chip 800 may be electrically connected to a bonding pad portion 704 of the lead frame 700 by a second bonding wire 600. The second bonding wire 600 may electrically connect the one bonding pad portion 704 to one fourth chip pad 820 of the fourth semiconductor chip 800 using first, second and third stepped pads 230, 330, 430 provided respectively on the stepped portions of the first, second and third semiconductor chips 200, 300, 400.

A sealing member 900 may be formed to cover the first to fourth semiconductor chips, and an outer lead portion 706 of the lead frame 700 may extend outwardly to be mounted on a module substrate (not illustrated) to provide a memory module (not illustrated).

Hereinafter, a method of manufacturing a semiconductor package in accordance with a first example embodiment will be explained.

FIGS. 8 to 11 are cross-sectional views illustrating a method of manufacturing the semiconductor package in FIG. 1.

Figure 8:
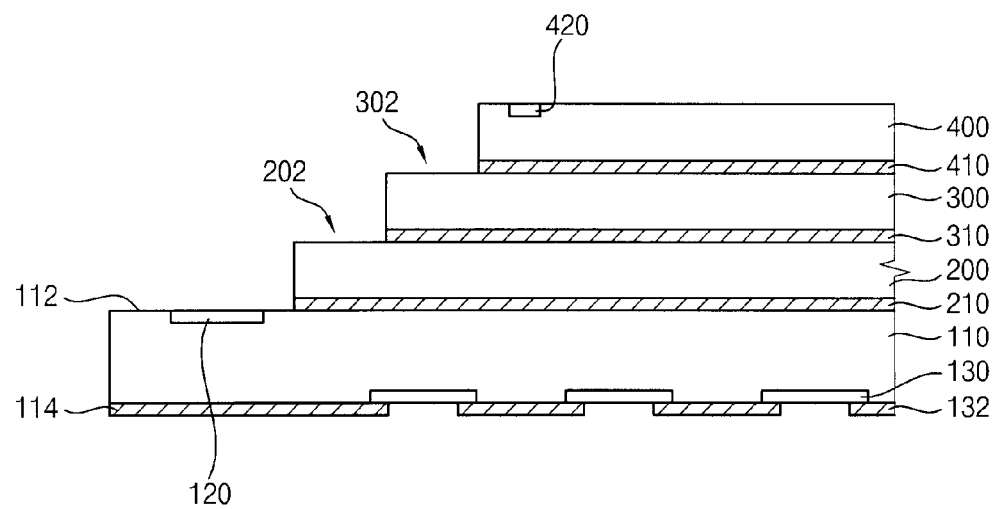

Referring to FIG. 8, a substrate 110 having a plurality of bonding pads 120 is prepared. A first semiconductor chip 200 is stacked on a first face of the substrate 110. The first semiconductor chip 200 has a plurality of first chip pads along a side portion thereof. For example, the first semiconductor chip 200 may be adhered to the substrate 110 via a first adhesive layer 210.

A second semiconductor chip 300 is stacked on the first semiconductor chip 200. The second semiconductor chip 300 has a plurality of second chip pads along a side portion thereof. For example, the second semiconductor chip 300 may be adhered to the first semiconductor chip 200 via a second adhesive layer 310.

The second semiconductor chip 300 is stacked like a step of a staircase to form a first stepped portion 202 on the first semiconductor chip 200. In the first stepped portion 202 provided on the first semiconductor chip 200, the first chip pads are exposed through the side portion of the second semiconductor chip 300.

A third semiconductor chip 300 is stacked on the second semiconductor chip 300. The third semiconductor chip 400 has a plurality of third chip pads 420 along a side portion thereof. For example, the third semiconductor chip 400 may be adhered to the second semiconductor chip 300 via a third adhesive layer 410.

The third semiconductor chip 400 is stacked like a step of a staircase to form a second stepped portion 302 on the second semiconductor chip 300. In the second stepped portion 302 provided on the second semiconductor chip 300, the second chip pads are exposed through the side portion of the third semiconductor chip 400.

Figure 9:
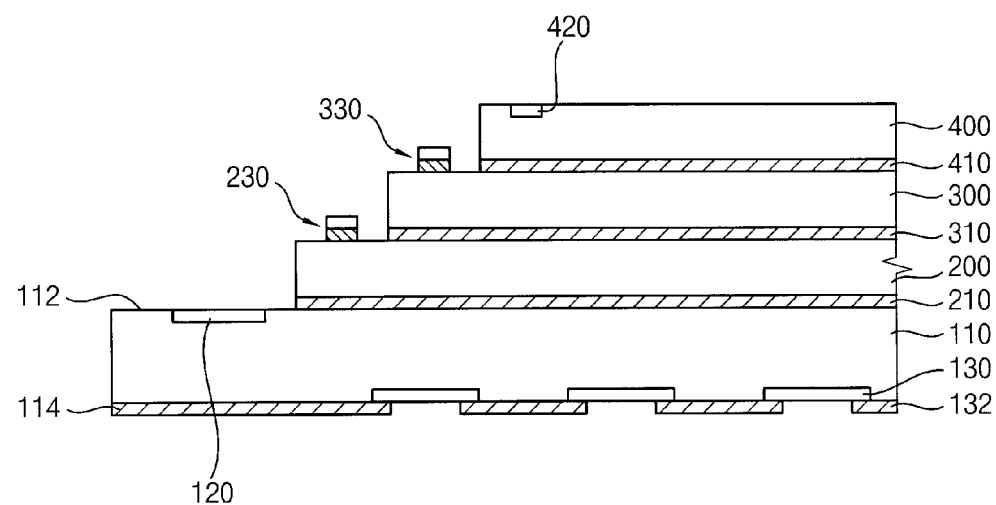

Referring to FIG. 9, a first stepped pad 230 is disposed on the first stepped portion 202 of the first semiconductor chip 200 and a second stepped pad 330 is disposed on the second stepped portion 302 of the second semiconductor chip 300. The first stepped pad 230 may be arranged between the first chip pads. The second stepped pad 330 may be arranged between the second chip pads.

The first stepped pad 230 may include a first adhesive pad and a first conductive pad. The second stepped pad 330 may include a second adhesive pad and a second conductive pad. For example, the first and second adhesive pads may include a nonconductive adhesive film. The first and second conductive pad may include a conductive material. Examples of the conductive material may be gold (Au), silver (Ag), copper (Cu), aluminum (Al), etc. The conductive material may be selected from the material having a great adhesive strength for the bonding wire. The first and second stepped pads may be easily adhered using adhesive strengths of the first and second adhesive pads on the first and second semiconductor chips 200 and 300, respectively.

Figure 10:
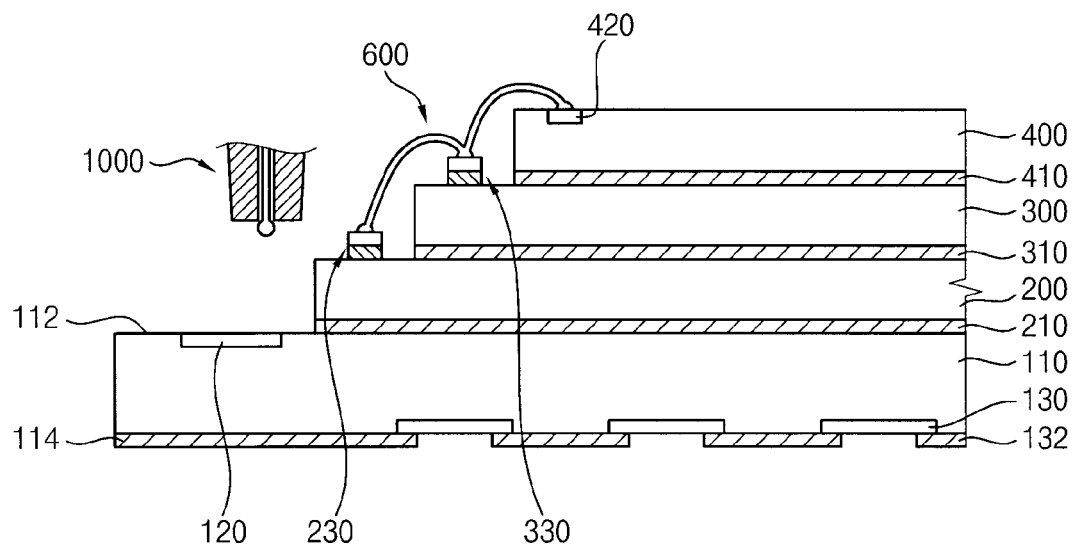

Referring to FIGS. 1 and 10, the third chip pads 420 of the third semiconductor chip 400 are electrically connected to the bonding pads 120 using a plurality of first bonding wires 500. Another third chip pad 420 of the third semiconductor chip 400 is electrically connected to the bonding pad 120 using a second bonding wire 600.

For example, a first wire 510 of the first bonding wire 500 electrically connects the one bonding pad 210 to the one first chip pad 220. A second wire 520 of the first bonding wire 500 electrically connects the one first chip pad 220 to the one second chip pad 320. A third wire 530 electrically connects the one second chip pad 320 to the one third chip pad 420. Accordingly, the bonding pad 120 may be electrically connected to the third chip pad 420 by the first bonding wire 500.

The second bonding wire 600 may electrically connect the one bonding pad 120 to the one third chip pad 420 using the first and second stepped portions 230 and 330.

As illustrated in FIG. 10, while a capillary 1000 of a bonding apparatus moves from the third chip pad 420 to the second stepped pad 330, a file metal line is extended out of the capillary 1000. Accordingly, a sixth wire 630 of the second bonding wire 600 electrically connects the second conductive pad of the second stepped pad 330 to the third chip pad 420.

While the capillary 1000 moves from the second stepped pad 330 to the first stepped pad 230, a file metal line is extended out of the capillary 1000. Accordingly, a fifth wire 620 of the second bonding wire 600 electrically connects the first conductive pad of the first stepped pad 230 to the second conductive pad of the second stepped pad 330.

While the capillary 1000 moves from the first stepped pad 230 to the bonding pad 120, a file metal line is extended out of the capillary 1000. Accordingly, a fourth wire 610 of the second bonding wire 600 electrically connects the first conductive pad of the first stepped pad 230 to the bonding pad 120. Accordingly, the bonding pad 120 may be electrically connected to the third chip pad 420 using the first and second stepped pads 230 and 330.

Figure 11:
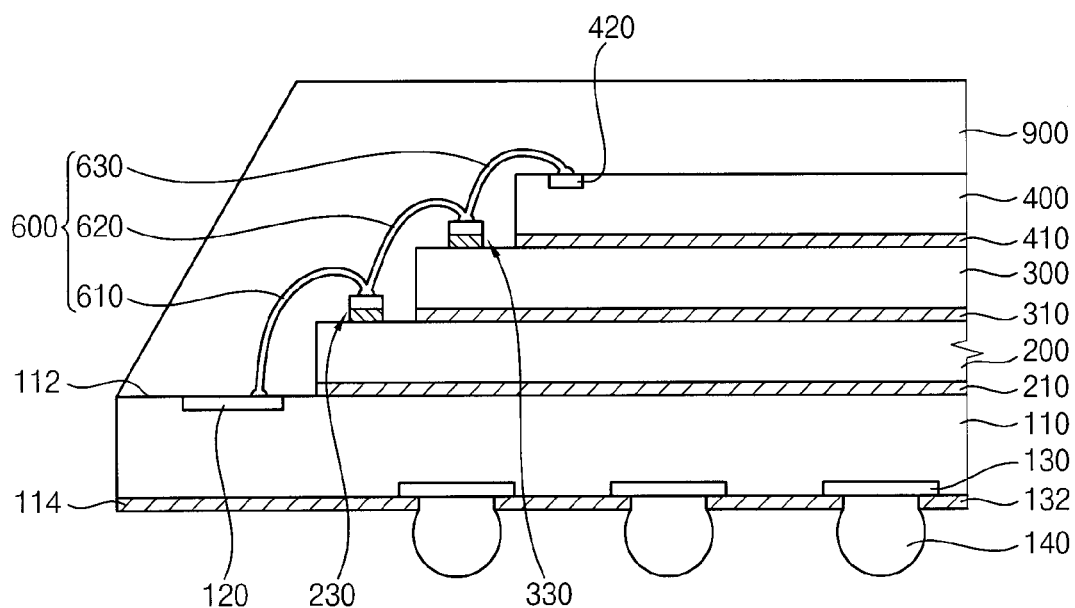

Referring to FIG. 11, a sealing member 900 is formed on the substrate 110 to cover the first, second and third semiconductor chips 200, 300, 400.

Then, a solder ball 140 is disposed on a solder ball pad 130 exposed by an insulation layer 132 on a second face 114 of the substrate 110. The substrate is mounted on a module substrate (not illustrated) via the solder balls 140 to complete a memory module (not illustrated).

As mentioned above, a semiconductor package in accordance with example embodiments includes a plurality of semiconductor chips stacked on a substrate and stepped pads serving as stepping stones between the uppermost semiconductor chip and the substrate. The stepped pads may relay intermediate wires to electrically connect the uppermost semiconductor chip to a bonding pad of the substrate.

Accordingly, the stepped pads may provide a free wiring route design for a bonding wire. Additionally, the stepped pads may compensate the height differences between the stacked semiconductor chips to decrease the loop height of the bonding wire to thereby miniaturize the semiconductor package. Further, the bonding wire may be prevented from making contact with the adjacent another bonding wire that is spaced apart by a relatively small distance or the semiconductor chips, to thereby improve reliability of the semiconductor package.

The foregoing is illustrative of example embodiments and is not to be construed as limiting thereof. Although a few example embodiments have been described, those skilled in the art will readily appreciate that many modifications are possible in example embodiments without materially departing from the novel teachings and advantages of the present invention. Accordingly, all such modifications are intended to be included within the scope of example embodiments as defined in the claims. In the claims, means-plus-function clauses are intended to cover the structures described herein as performing the recited function and not only structural equivalents but also equivalent structures. Therefore, it is to be understood that the foregoing is illustrative of various example embodiments and is not to be construed as limited to the specific example embodiments disclosed, and that modifications to the disclosed example embodiments, as well as other example embodiments, are intended to be included within the scope of the appended claims.

What is claimed is:

1. A semiconductor package, comprising:
    a first semiconductor chip stacked on a substrate having a plurality of bonding pads, the first semiconductor chip having a plurality of first chip pads formed along a side portion of the first semiconductor chip;
    a second semiconductor chip stacked like a step of a staircase on the first semiconductor chip to form a stepped portion through which the first chip pads are exposed on the first semiconductor chip, the second semiconductor chip having a plurality of second chip pads formed along a side portion of the first semiconductor chip;
    a stepped pad arranged between the first chip pads on the stepped portion of the first semiconductor chip, the stepped pad including an adhesive pad adhered to the first semiconductor chip and a conductive pad formed on the adhesive pad;
    a plurality of first bonding wires electrically connected between at least one of the one second chip pad and the one first chip pad or between the one first chip pad and the one bonding pad;
    a second bonding wire electrically connected between the one second chip pad and the one bonding pad using the stepped pad; and
    wherein the stepped pad is adhered to a dummy pad that is not electrically connected to a circuit element of the first semiconductor chip.

2. The semiconductor package of claim 1, wherein the adhesive pad of the stepped pad comprises a nonconductive adhesive film and the conductive pad of the stepped pad comprises a conductive material.

3. The semiconductor package of claim 1, further comprising at least one routing stepped pad arranged at a desired position on the second semiconductor chip, and wherein the second bonding wire is electrically connected between the one second chip pad and the one bonding pad using the stepped pad and the routing stepped pad.

4. The semiconductor package of claim 1, further comprising at least one third semiconductor chip, the third semiconductor chip stacked like a step of a staircase between the first semiconductor chip and the substrate.

5. The semiconductor package of claim 1, wherein the first chip pads are arranged in a direction substantially the same as the arrangement direction of the second chip pads.

6. The semiconductor package of claim 1, wherein the first and second bonding pads extend substantially perpendicular to the side portion of the window.

7. The semiconductor package of claim 1, wherein the first and second semiconductor chips are stacked on a lead frame.

8. The semiconductor package of claim 1, further comprising a first adhesive layer between the first semiconductor chip and the substrate; and a second adhesive layer between the second semiconductor chip and the first semiconductor chip.

9. The semiconductor package of claim 8, further comprising a sealing member that is formed on the substrate to cover the first and second semiconductor chips.

10. A method of manufacturing a semiconductor package, comprising:
    stacking a first semiconductor chip on a substrate having a plurality of bonding pads, the first semiconductor chip having a plurality of first chip pads formed along a side portion of the first semiconductor chip;
    stacking a second semiconductor chip like a step of a staircase on the first semiconductor chip to form a stepped portion through which the first chip pads are exposed on the first semiconductor chip, the second semiconductor chip having a plurality of second chip pads formed along a side portion of the first semiconductor chip;
    adhering a stepped pad between the first chip pads on the stepped portion of the first semiconductor chip;

electrically connecting a plurality of first bonding wires between at least of the one second chip pad and the one first chip pad or between the one first chip pad and the one bonding pad;

electrically connecting a second bonding wire between the one second chip pad and the one bonding pad using the stepped pad; and wherein adhering the stepped pad comprises adhering the stepped pad to a dummy pad that is not electrically connected to a circuit element of the first semiconductor chip.

11. The method of claim 10, wherein adhering the stepped pad comprises adhering an adhesive pad on the stepped portion of the first semiconductor chip exposed from the side portion of the second semiconductor chip; and forming a conductive pad on the adhesive pad.

12. The method of claim 11, wherein the adhesive pad comprises a nonconductive adhesive film.

13. The method of claim 10, further comprising stacking at least one third semiconductor chip like a step of a staircase between the first semiconductor chip and the substrate.

14. The method of claim 10, further comprising forming a sealing member on the substrate to cover the first and second semiconductor chips.

15. The method of claim 10, further comprising adhering at least one routing stepped pad at a desired position on the second semiconductor chip, and wherein electrically connecting the second bonding wire between the second chip pad and the bonding pad comprises connecting the second bonding wire between the second chip pad and the bonding pad using the stepped pad and the routing stepped pad.

16. The method of claim 10, wherein stacking the first semiconductor chip comprises stacking the first semiconductor chip on a lead frame.

* * * * *